(12) United States Patent
Wang

(10) Patent No.: US 7,656,248 B2
(45) Date of Patent: Feb. 2, 2010

(54) EQUALIZER AND RELATED SIGNAL EQUALIZING METHOD

(75) Inventor: Teng-Yi Wang, Hsinchu (TW)

(73) Assignee: Realtek Semiconductor Corp., Hsinchu (TW)

( * ) Notice: Subject to any disclaimer, the term of this patent is extended or adjusted under 35 U.S.C. 154(b) by 80 days.

(21) Appl. No.: 12/111,722

(22) Filed: Apr. 29, 2008

(65) Prior Publication Data

US 2008/0267417 A1    Oct. 30, 2008

(30) Foreign Application Priority Data

Apr. 30, 2007    (TW) .............................. 96115231 A

(51) Int. Cl.
 *H03H 7/30*    (2006.01)
(52) U.S. Cl. ..................... 333/28 R; 375/233
(58) Field of Classification Search ............... 333/28 R; 375/229, 232, 233
See application file for complete search history.

(56) References Cited

U.S. PATENT DOCUMENTS 5,880,645 A * 3/1999 Everitt et al. .................. 333/18

* cited by examiner

*Primary Examiner*—Stephen E Jones
(74) *Attorney, Agent, or Firm*—Muncy, Geissler, Olds & Lowe, PLLC

(57) ABSTRACT

An equalizer is disclosed. The equalizer includes a filter, configured to receive the first transmission signal, to perform a filtering operation on the first transmission signal according to a feedback signal to generate an output signal; a first slicer, configured to generate a first sliced signal according to a signal level of the output signal and to adjust an amplitude of the first sliced signal according to an amplitude control signal; a boost control module, configured to generate the feedback signal according to the output signal and the first sliced signal; and a control circuit, configured to receive a second transmission signal on the transmission line and to output the amplitude control signal according to an amplitude of the second transmission signal.

20 Claims, 2 Drawing Sheets

EQUALIZER AND RELATED SIGNAL EQUALIZING METHOD

BACKGROUND OF THE INVENTION

1. Field of the Invention

The present invention relates to an equalizer, and more particularly, to a continuous-time adaptive equalizer.

2. Description of the Related Art

As is well known in the art, when a signal is transferred via a transmission line, the signal decays during the transmission process. This means that for transmission lines having a great length, the signal decay is more obvious. Therefore, when the signal arrives at the destination (for example, a receiver), the signal received by the receiver may contain distortions.

In order to solve the above-mentioned problem, an equalizer is often established logically in front of (i.e., before) the receiver such that the original signal can be recovered from the decayed signal. This allows the receiver to correctly process the received signal.

For example, in the data transmission of a USB interface, a PCI-E interface of a computer system, or the data transmission of an HDMI interface of an LCD, high-frequency portions of the signal often decay in the transmission process. Therefore, the aforementioned equalizer is often established at the receiving ends of the above-mentioned interfaces to provide an appropriate gain for the high-frequency portions of the signal such that the original signal can be recovered from the decayed signal. In this way, said computer system or said LCD can process the recovered signal.

In "ISSCC2005/SESSION18/HIGH-SPEED INTERCONNECTS AND BUILDING BLOCKS/18.1 (A 10 Gb/s CMOS Adaptive Equalizer for Backplane Applications)" published by Srikanth Gandi, Jri Lee, Daishi Takeuchi, and Brhzad Razavi, a continuous-time adaptive equalizer is disclosed. Please refer to FIG. 1. FIG. 1 is a block diagram of a conventional continuous-time adaptive equalizer 100. As shown in FIG. 1, the continuous-time adaptive equalizer 100 comprises an active high-pass filter 110, a slicer 120, a boost control module 130, a swing control module 140, and a buffer 150.

The active high-pass filter 110 is utilized to perform the above-mentioned amplifying (signal recovery) operation. In other words, the active high-pass filter 110 performs the amplifying operation on the high-frequency portions of the received data signal $D_{in}$ to output a processed data signal $D_{out}$. The processed data signal $D_{out}$ is then buffered by the buffer 150, and is further outputted to a following receiver (not shown in FIG. 1).

However, when the equalizer 100 receives the data signal $D_{in}$, the equalizer 100 cannot predict the condition of the data signal $D_{in}$. For example, the equalizer 100 cannot determine the degree of signal decay. Therefore, the equalizer 100 requires an adjusting mechanism to dynamically adjust the filtering frequency band of the active high-pass filter according to the properties of the data signal $D_{in}$.

In this case, the slicer 120 and the boost control module 130 are utilized as the above-mentioned adjusting mechanism. As shown in FIG. 1, the slicer 120 and the boost control module 130 form a feedback loop to control the filtering frequency band of the active high-pass filter 110.

The slicer 120 converts the signal at node A ($D_{out}$) into a square wave. The boost control module 140 outputs a feedback signal to the active high-pass filter 110 according to the difference between the signals at the node A and node B such that the filtering frequency band (i.e., the frequency response) of the active high-pass filter 110 can gradually approach a desired frequency band according to the feedback signal. In this way, the data signal $D_{out}$ eventually may resemble the originally transmitted data signal.

However, if only the boost control loop is utilized, the accuracy of the data signal $D_{out}$ cannot be guaranteed. Please note, the equalizer 100 cannot determine the amplitude of the data signal $D_{out}$ when receiving the data signal $D_{out}$. It is apparent that if the square wave outputted from the slicer 120 does not correspond to the signal $D_{out}$ at the node A, then the boost control module 130 may lock the entire equalizer 100 on an incorrect operational point. This will cause the active high-pass filter 110 have incorrect frequency responses such that the data signal $D_{out}$ cannot be recovered as the original data signal.

Therefore, the swing control module 140 is established to solve the above-mentioned problem. In this case, the slicer 120 and the swing control module 140 form another feedback loop. The additional feedback loop is utilized to control the slicer 120 to output a square wave having a desired amplitude. In other words, the swing control module 140 outputs another feedback signal according to the amplitude differences between the signals at node A and node B such that the slicer 120 is controlled to output the square wave having the same amplitude as the signal at the node A.

Utilizing these two above-mentioned feedback loops, the equalizer 100 can ensure that the outputted data signal $D_{out}$ is very close to corresponding to the original data signal. This results in an improvement to the signal transmission quality.

Unfortunately, the above-mentioned equalizer 100 has disadvantages. As shown in FIG. 1, two feedback loops lie in the same signal route. As is well known, the two feedback loops cannot work simultaneously. In fact, if the two feedback loops were simultaneously in operation then the stability of the entire equalizer 100 may be reduced. For example, the two feedback loops may introduce an oscillation, and thus the stability of the equalizer 100 is reduced by said oscillation. Therefore, in the actual application, in order to increase the stability of the equalizer 100, the operational speed (i.e., the frequency band) of the swing control module 140 (the swing control loop) must be greater than that of the boost control module 130. In other words, the equalizer 100 should firstly use the swing control module 140 to make the amplitudes of the signals at the node A and node B equal. Secondly, after the amplitudes of the signals at the node A and node B are adjusted, the equalizer 100 is switched such that the boost control module 130 becomes active and starts operation. In this way, the boost control module 130 can start to perform the above-mentioned feedback control to adjust the high frequency swing of the data signal $D_{out}$ such that the high frequency swing of the data signal $D_{out}$ can be outputted correctly.

To speak more simply, the circuit designer must evaluate and analyze the stability of the equalizer 100 and thereafter implement a more complex design to ensure that the equalizer 100 operates correctly. If the equalizer 100 is poorly designed, (for example, the operating time of the swing control module 140 is insufficient to make the amplitudes of the signals at the node A and node B equal to one another), the boost control module 130 cannot correctly perform the feedback control such that the active high-pass filter 130 has incorrect frequency responses and the original data cannot be recovered.

Furthermore, if the frequency bandwidth of the boost control module 130 is lower than the swing control module 140, larger capacities must be utilized in the boost control module 140. This increases the space requirements of the entire circuit and thereby increases the power consumption of the equalizer 100.

SUMMARY OF THE INVENTION

In view of the above-mentioned problems, an object of the invention is to provide a continuous-time adaptive equalizer, which utilizes two individual loops respectively performing the boost control operation and the swing control operation, such that the above-mentioned problems are solved.

According to an embodiment of the claimed invention, an equalizer, for equalizing a first transmission signal on a transmission line is disclosed. The equalizer comprises: a filter, configured to receive the first transmission signal, to perform a filtering operation on the first transmission signal according to a feedback signal to generate an output signal; a first slicer, coupled to the filter, configured to generate a first sliced signal according to a signal level of the output signal and to adjust an amplitude of the first sliced signal according to an amplitude control signal; a boost control module, coupled to the filter and the first slicer, configured to generate the feedback signal according to the output signal and the first sliced signal; and a control circuit, coupled to the first slicer, configured to receive a second transmission signal on the transmission line and to output the amplitude control signal according to an amplitude of the second transmission signal.

According to another embodiment of the claimed invention, a signal equalizing method, for equalizing a first transmission signal on a transmission line is disclosed. The signal equalizing method includes: receiving the first transmission signal; performing a filtering operation on the first transmission signal according to a feedback signal to generate an output signal; generating a first sliced signal according to a signal level of the output signal and adjusting an amplitude of the first sliced signal according to an amplitude control signal; generating the feedback signal according to the output signal and the first sliced signal; receiving a second transmission signal on the transmission line and outputting the amplitude control signal according to an amplitude of the second transmission signal.

The claimed invention continuous-time adaptive equalizer utilizes two individual loops to respective perform the boost control operation and the swing control operation. Therefore, the claimed invention does not suffer from the disadvantages of the dual loop according to the prior art. This reduces the complexity of the circuit design, and also reduces the area requirements of the entire circuit and thereby the circuit's power consumption.

DETAILED DESCRIPTION OF THE INVENTION

Figure 1:
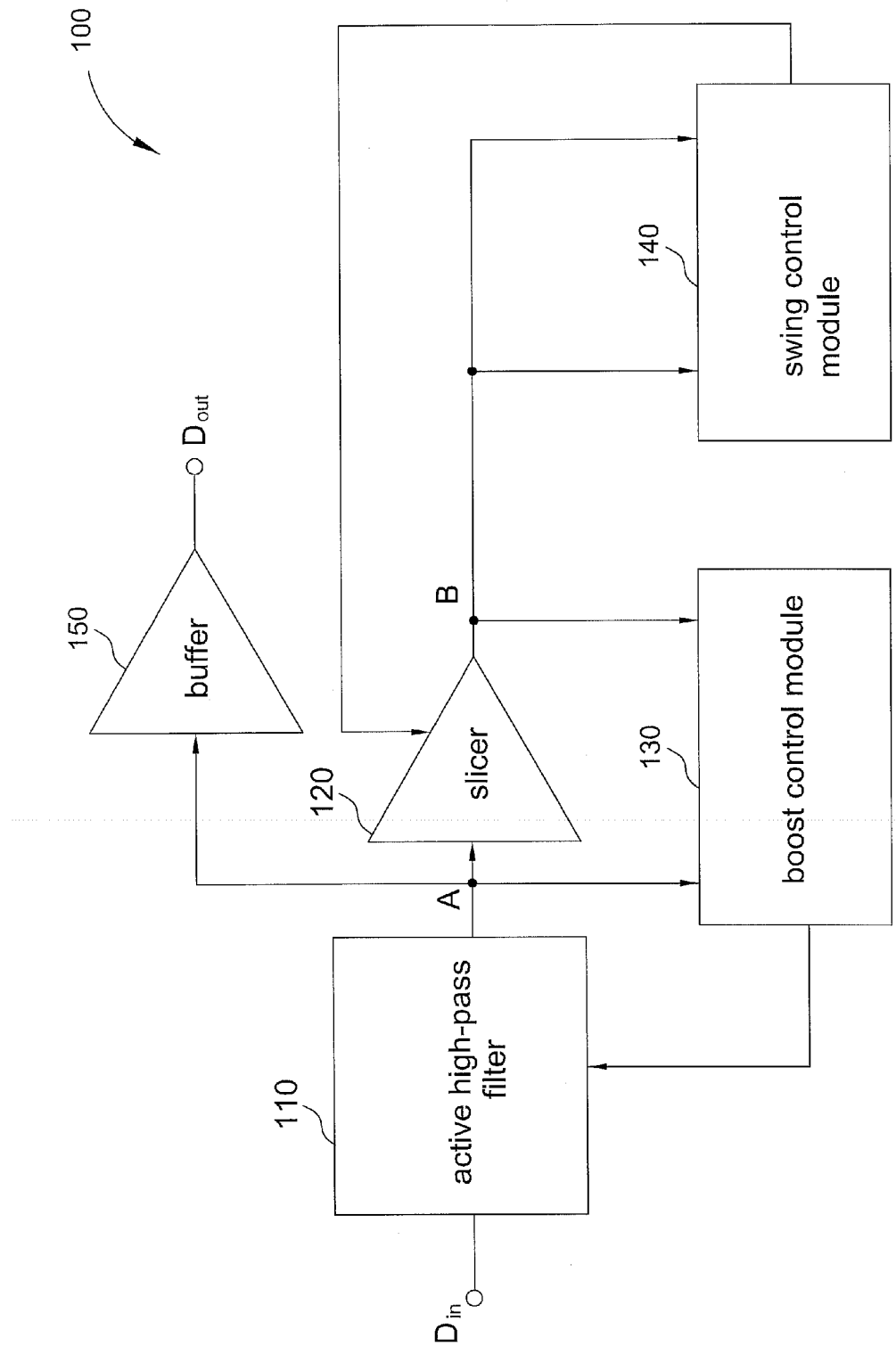
FIG. 1 is a block diagram of a conventional continuous-time adaptive equalizer.
Figure 2:
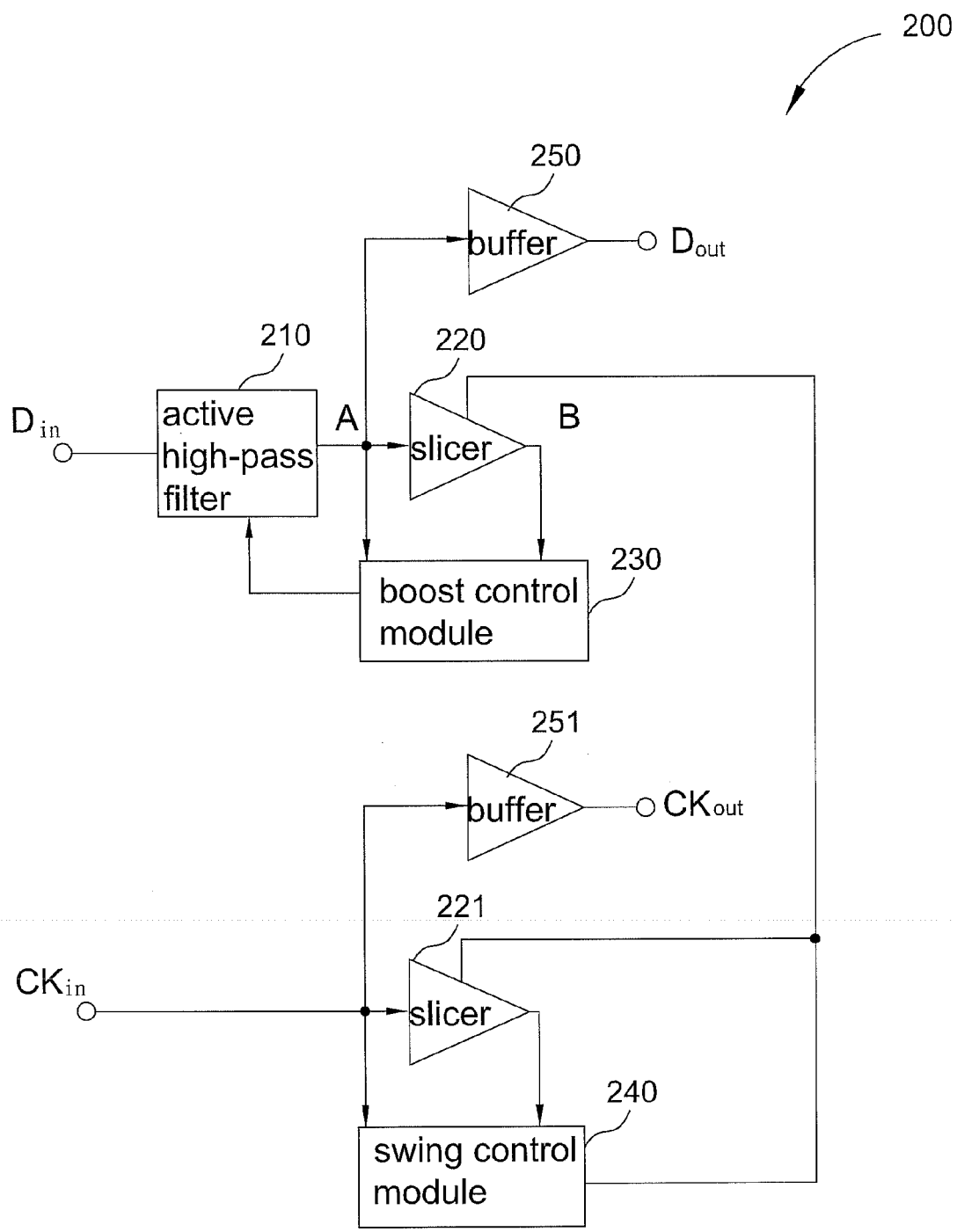
FIG. 2 is a block diagram of a continuous-time adaptive equalizer according to an embodiment of the present invention.

Please refer to FIG. 2. FIG. 2 is a block diagram of a continuous-time adaptive equalizer according to an embodiment of the present invention. As shown in FIG. 2, the continuous-time adaptive equalizer 200 comprises an active high-pass filter 210, two slicers 220 and 221, a boost control module 230, a swing control module 240, and two buffers 250 and 251.

The boost control module 230 and the swing control module 240 have the same functions, operations, and circuit configurations as the boost control module 130 and the swing control module 140. One skilled in the art can easily understand the operation and thus further details are omitted herein.

Before illustrating the techniques of the present invention, please note, in some transmission interfaces, such as HDMI, DVI, LVDS, and RSDS interfaces, a clock signal is transferred along with the data signal. In addition, as is well known in the art, the above-mentioned clock signal and the data signal have the same amplitude.

Please note, the present invention utilizes the above-mentioned characteristic to perform the swing control operation. That is, the present invention utilizes the above-mentioned clock signal to perform the swing control operation. This mechanism can work as efficiently as, or even more efficiently than, utilizing the data signal to perform the swing control operation as in done in the prior art.

In addition, as shown in FIG. 2, the equalizer 200 comprises two signal routes, where one signal route is utilized to receive the data signal $D_{in}$ in the boost control loop. The other signal route is utilized to receive the clock signal $CK_{in}$ in the swing control loop.

Similarly, the active high-pass filter 210 is utilized to perform the filtering operation. In other words, the active high-pass filter 210 amplifies the high frequency portions of the received signal $D_{in}$ and outputs an equalized data signal $D_{out}$. The equalized data signal $D_{out}$ is buffered by the buffer 250, and then outputted to a following receiver (not shown in FIG. 2).

The slicer 220 and the boost control module 230 form a boost control loop to control the filtering band of the active high-pass filter 210. The slicer 220 converts the signal $D_{out}$ at node A into a square wave signal. The boost control module 240 outputs a feedback signal to the active high-pass filter 210 according to the difference between the signals at node A and node B such that the filtering frequency band (i.e., the frequency response) of the active high-pass filter 210 will gradually approach a desired frequency band according to the feedback signal. In this way, the data signal $D_{out}$ can also eventually resemble the originally transmitted signal.

Moreover, similarly, in order to ensure that the boost control module 230 can work correctly to lock the entire circuit on a correct operational point (i.e., to make the active high-pass filter 210 have correct frequency responses), the equalizer 200 needs another adjusting mechanism to make the square wave signal outputted from the slicer 220 have the same amplitude as that of the signal at the node A.

As is shown in FIG. 2, the clock signal is $CK_{in}$ is buffered by the buffer 251 and then outputted as the clock signal $CK_{out}$. Please note, in this embodiment, the clock signal $CK_{in}$ is further utilized for the above-mentioned mechanism. That is, the slicer 221 and the swing control module 240 further utilize the clock signal $CK_{in}$ to perform the swing control operation such that the square wave signal outputted from the slicer 220 has the same amplitude as that of the signal at the node A.

In this embodiment, the slicer 221 converts the clock signal $CK_{in}$ into a square wave signal. As mentioned previously, the clock signal $CK_{in}$ and the data signal $D_{in}$ substantially have the same amplitude. Therefore, if the slicer 221 and the slicer 220 have the same structure, to detect the difference between the input and the output of the slicer 221 is equivalent to detecting the difference between the input and the output of the slicer 220.

Therefore, in this embodiment, the swing control module 240 detects the difference between the amplitude (or the equivalent signal level) of the square wave outputted from the slicer 221 and the amplitude of the clock signal $CK_{in}$ and outputs an amplitude control signal to the slicer 221 according to the difference. This amplitude control signal can control the slicer 221 to output a square wave signal having the same amplitude as that of the clock signal $CK_{in}$. In addition, the above-mentioned square wave signal is also inputted into the slicer 220. Therefore, when the amplitude of the square wave signal outputted from the slicer 221 is the same as that of the clock signal $CK_{in}$, the square wave signal outputted from the slicer 220 and the data signal $D_{out}$ have the same amplitude.

Furthermore, in another embodiment according to the present invention, the amplitude control signal outputted from the swing control module 240 can control a current source inside the slicer 220 and the slicer 221 to change the current provided by the current source. Likewise the amplitude control signal can be designed to control a resistance of a resistor inside the slicer 220 and the slicer 221. In this way, the slicers 220 and 221 can be controlled to output square wave signals having the same amplitude as that of the input signals (e.g., the data signal $D_{in}$ or the clock signal $CK_{in}$).

Please note, the clock signal $CK_{in}$ often has a more completed waveform than the data signal. Therefore, detecting the difference between the input and the output of the slicer 221 should be better than detecting the difference between the input and the output of the slicer 220.

From the above disclosure, it can be understood that through using the aforementioned swing control loop, the present invention slicer 220 outputs a square wave signal having the same amplitude as that of the data signal $D_{out}$. Therefore, the boost control loop can also operate correctly to make the data signal $D_{out}$ resemble with the original data.

Please note, the present invention uses two individual loops. That is, the two individual and independent loops lie in different signal routes. The two loops are used to perform the boost control operation and the swing control operation. Therefore, the two independent loops can work simultaneously without oscillation occurring. As a result, the present invention continuous-time adaptive equalizer 200 has improved stability over the prior art. In addition, when the adaptive equalizer 200 is being designed, an analysis of the stability of the circuit should not be very complex. Additionally, because there are no large capacitors required in the circuit design, the circuit area is reduced.

Furthermore, because two loops can work simultaneously, this allows the swing control module 240 to simultaneously adjust the amplitudes of the signals at node A and node B while the boost control module 230 is performing the feedback control operation. Therefore, in contrast to the prior art equalizer, the present invention does not need to consider the operation time of the swing control module 240 or that this might be insufficient to make the amplitudes of the signals of node A and node B equal to one another. Please note, the swing control module 240 continuously adjusts the amplitudes of the signals at the node B and the order of the operations of the swing control module 240 and the boost control module 230 are not predetermined. Therefore, after the entire system operates for a while, the swing control module 240 can generate the amplitudes of signals at node A and node B, this ensures that the data signal $D_{out}$ can correctly correspond to the original signal data.

In the above disclosure, the present invention continuous-time adaptive equalizer 200 utilizes the clock signal to perform the feedback control operation, and therefore is mainly utilized in HDMI, DVI, LVDS, and RSDS interfaces. However, the above-mentioned interfaces are only regarded as embodiments, and not limitations of the present invention. In the actual implementation, as long as a reference signal and the data signal correspond to the same amplitude, the reference signal can be utilized in the amplitude control mechanism.

For example, in USB or PCI-E interfaces, there is no clock signal being transferred. But there are multiple data signals being transferred at the same time. Therefore, the present invention can utilize another data signal as the reference signal of the amplitude control mechanism. In other words, in FIG. 2, the clock signal $CK_{in}$ can be replaced by another data signal and the same objective is achieved.

The present invention can even utilize the same data signal as the reference signal. In other words, in FIG. 2, the clock signal $CK_{in}$ can be replaced by the data signal $D_{in}$ (or the data signal $D_{out}$) and the same objective is achieved.

Please note, in the above disclosure, the slicers 250 and 251 are utilized to convert the data signal (or clock signal) into square wave signals. However, the slicer is only regarded as a preferred embodiment, not a limitation of the present invention. In the actual implementation, a circuit capable of converting signals into square wave signals can be utilized to replace the slicers 250 and 251. For example, a sample-and-hold circuit, a 1-bit ADC, a comparator, and a data recovery circuit can all be used as replacements for the slicer. These changes also obey the spirit of the present invention.

In addition, one skilled in the art can understand and implement the above-mentioned active high-pass filter 210. For example, for an aspect of frequency responses, the active high-pass filter 210 has adjustable poles and zeros. That is, the active high-pass filter 210 can adjust its poles and zeros according to the received feedback signal such that the frequency responses of the filter 210 can be adjusted (this equivalently adjusts the filtering band and the gain of the filter 210). As mentioned previously, in an embodiment of the present invention, the active high-pass filter 210 can comprise adjustable capacitors or resistors. These adjustable devices can be adjusted according to the feedback signal such that the aforementioned mechanism can be achieved. For example, the resistance and the capacitance can be adjusted.

In contrast to the prior art, the present invention continuous-time adaptive equalizer utilizes two individual loops to respective perform the boost control operation and the swing control operation. Therefore, the present invention does not have the disadvantages of the dual loop according to the prior art. This reduces the complexity of the circuit design, and also reduces the area (i.e., space) requirements of the entire circuit and thereby power consumption is reduced.

While certain exemplary embodiments have been described and shown in the accompanying drawings, it is to be understood that such embodiments are merely illustrative of and not restrictive on the broad invention, and that this invention should not be limited to the specific construction and arrangement shown and described herein, since various other modifications may occur to those ordinarily skilled in the art.

What is claimed is:

1. An equalizer, for equalizing a first transmission signal on a transmission line, the equalizer comprising:
    a filter, configured to receive the first transmission signal, to perform a filtering operation on the first transmission signal according to a feedback signal to generate an output signal;
    a first slicer, coupled to the filter, configured to generate a first sliced signal according to a signal level of the output signal and to adjust an amplitude of the first sliced signal according to an amplitude control signal;

a boost control module, coupled to the filter and the first slicer, configured to generate the feedback signal according to the output signal and the first sliced signal; and a control circuit, coupled to the first slicer, configured to receive a second transmission signal on the transmission line and output the amplitude control signal to control the amplitude of the first sliced signal of the first slicer according to an amplitude of the second transmission signal.

2. The equalizer of claim 1, wherein the control circuit comprises:

a second slicer, configured to receive the second transmission signal and to generate a second sliced signal according to a signal level of the second transmission signal; and a swing control module, coupled to the second slicer, configured to generate the amplitude control signal according to a difference between the second transmission signal and the second sliced signal.

3. The equalizer of claim 1, wherein the first transmission signal and the second transmission signal have substantially the same amplitude.

4. The equalizer of claim 1, wherein the first sliced signal is a square wave signal.

5. The equalizer of claim 1, wherein the second transmission signal is the first transmission signal.

6. The equalizer of claim 1, wherein the second transmission signal is a clock signal on the transmission line.

7. The equalizer of claim 1, wherein the feedback signal controls a capacitance of a capacitor of the filter to adjust frequency responses of the filter.

8. The equalizer of claim 1, wherein the amplitude control signal controls an amount of current outputted by a current source of the filter to adjust the amplitude of the first sliced signal.

9. The equalizer of claim 1, wherein the swing control signal controls a resistance of a resistor of the slicer to adjust the amplitude of the first sliced signal.

10. The equalizer of claim 1, wherein the filter is an active high-pass filter.

11. The equalizer of claim 1, utilized in USB, PCI-E, HDMI, DVI, LVDS, and RSDS interfaces.

12. A signal equalizing method, for equalizing a first transmission signal on a transmission line, the signal equalizing method comprising:

receiving the first transmission signal;

performing a filtering operation on the first transmission signal by a filter according to a feedback signal to generate an output signal;

generating a first sliced signal by a slicer according to a signal level of the output signal and adjusting an amplitude of the first sliced signal according to an amplitude control signal;

generating the feedback signal according to the output signal and the first sliced signal;

receiving a second transmission signal on the transmission line and outputting the amplitude control signal to control the amplitude of the first sliced signal according to an amplitude of the second transmission signal.

13. The signal equalizing method of claim 12, wherein the step of outputting the amplitude control signal to control the amplitude of the first sliced signal according to the amplitude of the second transmission signal comprises:

generating a second sliced signal according to the second transmission signal; and generating the amplitude control signal according to the amplitude of the second transmission signal and the amplitude of the second sliced signal.

14. The signal equalizing method of claim 12, wherein the first transmission signal and the second transmission signal have substantially the same amplitude.

15. The signal equalizing method of claim 12, wherein the second transmission signal is the first transmission signal.

16. The signal equalizing method of claim 12, wherein the second transmission signal is a clock signal on the transmission line.

17. The signal equalizing method of claim 12, further comprising:

controlling a capacitance of a capacitor of the filter for adjusting frequency responses of the filter.

18. The signal equalizing method of claim 12, further comprising:

controlling an amount of currents outputted by a current source of the filter for adjusting the amplitude of the first sliced signal.

19. The signal equalizing method of claim 12, further comprising:

controlling a resistance of a resistor of the slicer to adjust the amplitude of the first sliced signal.

20. The signal equalizing method of claim 12, utilized in USB, PCI-E, HDMI, DVI, LVDS, and RSDS interfaces.

* * * * *